United States Patent
Condorelli et al.

(10) Patent No.: US 9,897,630 B2
(45) Date of Patent: Feb. 20, 2018

(54) METHOD OF INTERFACING AN LC SENSOR AND RELATED SYSTEM

(71) Applicant: STMICROELECTRONICS S.r.l., Agrate Brianza (MB) (IT)

(72) Inventors: Riccardo Condorelli, Tremestieri Etneo/Catania (IT); Daniele Mangano, San Gregorio di Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 196 days.

(21) Appl. No.: 14/751,254

(22) Filed: Jun. 26, 2015

(65) Prior Publication Data
US 2016/0011235 A1    Jan. 14, 2016

(30) Foreign Application Priority Data
Jul. 9, 2014   (IT) .............................. TO2014A0548

(51) Int. Cl.
*G01R 15/16*   (2006.01)
*G01R 15/18*   (2006.01)
*G01D 3/032*   (2006.01)

(52) U.S. Cl.
CPC ............. *G01R 15/16* (2013.01); *G01D 3/032* (2013.01); *G01R 15/18* (2013.01)

(58) Field of Classification Search
CPC ........ G01R 15/16; G01R 11/46; G01R 21/00; G01R 11/465; G01J 1/42
USPC .......................................................... 324/655
See application file for complete search history.

(56) References Cited

U.S. PATENT DOCUMENTS

| 4,114,606 | A | * | 9/1978 | Seylar | .................. | A61B 5/0031 |
| | | | | | | 165/DIG. 401 |
| 4,279,257 | A | * | 7/1981 | Hochstein | ............ | A61B 5/0002 |
| | | | | | | 340/573.1 |
| 6,909,278 | B2 | * | 6/2005 | Hernitscheck | ....... | G01D 5/2013 |
| | | | | | | 324/174 |

(Continued)

FOREIGN PATENT DOCUMENTS

| CN | 102687399 A | 9/2012 |
| CN | 103512592 A | 1/2014 |

(Continued)

OTHER PUBLICATIONS

Bernard, Bruce E., W. Stephen Cheung, and Rogers C. Ritter. "Frequency-modulated coil sensor for magnetic suspensions." Review of Scientific Instruments 53.11 (1982): 1743-1745.*

(Continued)

*Primary Examiner* — Jermele M Hollington
*Assistant Examiner* — Christopher McAndrew
(74) *Attorney, Agent, or Firm* — Slater Matsil, LLP

(57) ABSTRACT

A method of interfacing an LC sensor with a control unit is described. The control unit may include first and second contacts, and the LC sensor may be connected between the first and second contacts. The method may include starting the oscillation of the LC sensor, and monitoring the voltage at the second contact, in which the voltage at the second contact corresponds to the sum of the voltage at the first contact and the voltage at the LC sensor. The voltage at the first contact may be varied such that the voltage at the second contact does not exceed an upper voltage threshold and does not fall below a lower voltage threshold.

26 Claims, 11 Drawing Sheets

(56) References Cited

U.S. PATENT DOCUMENTS

| | | | |
|---|---|---|---|
| 8,258,777 B2 | 9/2012 | Chen | |
| 2004/0036463 A1* | 2/2004 | Hernitscheck | G01D 5/2013 324/135 |
| 2008/0312856 A1* | 12/2008 | Feight | G01R 19/16547 702/64 |
| 2010/0033197 A1 | 2/2010 | Niwa | |
| 2010/0225332 A1* | 9/2010 | Niwa | H03K 17/9502 324/652 |
| 2010/0259282 A1* | 10/2010 | Niwa | H03K 17/9505 324/655 |
| 2011/0062943 A1* | 3/2011 | Kihara | H03K 5/01 324/76.39 |
| 2016/0011235 A1 | 1/2016 | Condorelli et al. | |

FOREIGN PATENT DOCUMENTS

| | | |
|---|---|---|
| CN | 205103413 U | 3/2016 |
| EP | 2 747 283 | 6/2014 |
| JP | H09326015 A | 12/1997 |
| WO | 2004001897 A1 | 12/2003 |

OTHER PUBLICATIONS

Christian Hernitscheck "Rotation Detection with the MSP430 Scan Interface", Apr. 2011, Texas Instruments Application Report; Nov. 2004; Revised Apr. 2011, pp. 1-26.
Application Note AN0029, "Low Energy Sensor Interface—Inductive Sensing", Rev. 1.05, May 9, 2013. pp. 1-23.

* cited by examiner

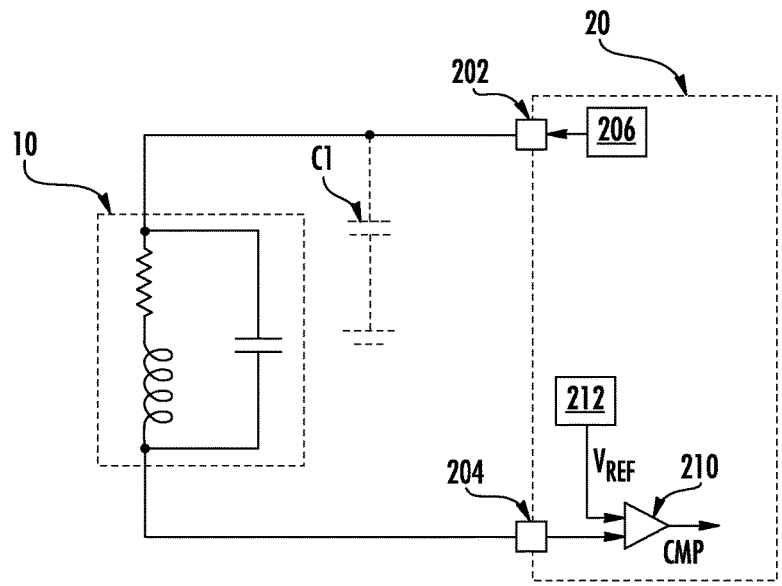
FIG. 4
PRIOR ART
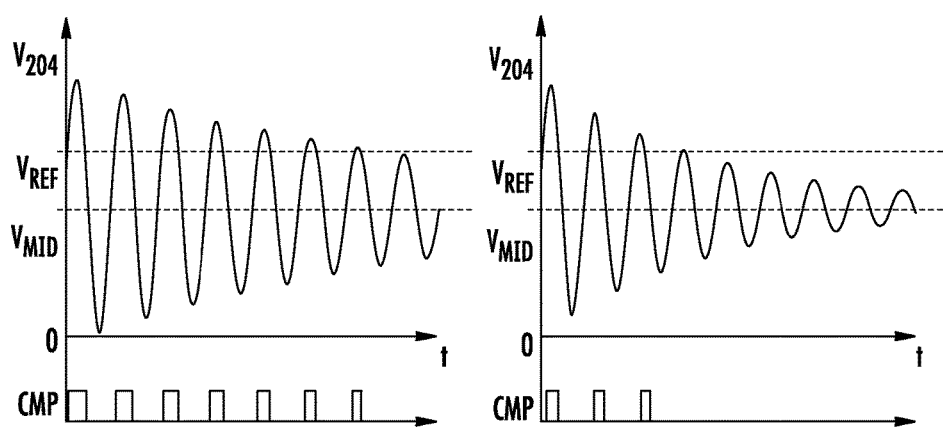
FIG. 5a
PRIOR ART
FIG. 5b
PRIOR ART

METHOD OF INTERFACING AN LC SENSOR AND RELATED SYSTEM

TECHNICAL FIELD

Embodiments of the present disclosure relate to techniques for interfacing an LC sensor.

BACKGROUND

LC sensors are well known in the art. For example, LC sensors may be used as electronic proximity sensors which are able to detect the presence of a conductive target. Some common applications of inductive sensors include, e.g., metal detectors and derived applications, such as rotation sensors.

FIG. 1 shows the basic structure of an LC sensor 10 in accordance with the prior art. In the example considered, the LC sensor 10 includes an inductor L and a capacitor C, which form a resonant circuit also called tank circuit. The arrangement further includes a power supply 102, such as a voltage source, and a switch 104. When the switch 102 is in a first position (as shown in FIG. 1), the capacitor C is charged up to the supply voltage. When the capacitor C is fully charged, the switch 102 changes position, placing the capacitor 102 in parallel with the inductor L so that it starts to discharge through the inductor L. This starts an oscillation between the LC resonant circuit 10.

From a practical point of view, the LC sensor 10 also includes resistive components R, which will dissipate energy over time. Accordingly, losses occur which will decay the oscillations, i.e., the oscillation is damped. Basically, such an LC sensor 10 may be used, e.g., to detect metallic objects, because the oscillation will be damped quicker in the presence of a metallic object (see, e.g., FIG. 2b) compared to an oscillation without a metallic object (see, e.g., FIG. 2a).

Generally speaking, the sensing component of an LC sensor 10 may be the inductor L, the capacitor C, and/or the resistor R. For example, the resistance R primarily influences the damping factor, while the L and C components primarily influence the oscillation frequency. Moreover, such an LC sensor 10 may also be created by simply connecting a capacitor C to an inductive sensor L, or an inductor L to a capacitive sensor C. However, the inductor L (with its dissipative losses) usually provides the sensing element.

FIG. 3a shows a possible embodiment for performing the LC sensing of the sensor 10 with a controller or control unit 20, such as a microcontroller, as described, e.g., in the documents Application Note AN0029, "Low Energy Sensor Interface—Inductive Sensing", Rev. 1.05, 2013-05-09, Energy micro, or Application Report SLAA222A, "Rotation Detection with the MSP430 Scan Interface", April 2011, Texas Instruments. In the example embodiment, the control unit 20 includes two pins or pads 202 and 204, and the LC sensor 10 is connected between these pins 202 and 204.

The control unit 20 includes a controllable voltage source 206 connected to the pin 202 to impose a fixed voltage $V_{MID}$ at this pin 202. For example, a digital-to-analog converter (DAC) is usually used for this purpose.

During a charge phase, the pin 204 is connected to ground GND. Accordingly, during this phase, the sensor 10 is connected between the voltage $V_{MID}$ and ground GND, and the capacitor C of the sensor 10 is charged to the voltage $V_{MID}$. Next, the control unit 20 opens the second pin 204, i.e., the pin 204 is floating. Accordingly, due to the fact that the capacitor C of the sensor 10 has been charged during the previous phase, the LC resonant circuit 10 starts to oscillate as described above.

Thus, by analyzing the voltage (e.g., voltage $V_{204}$) at pin 204, the oscillation may be characterized. In fact, as shown in FIG. 3b, the voltage at the pin 204 corresponds to a damped oscillation having a DC offset corresponding to the voltage $V_{MID}$, imposed by the voltage source 206, i.e., the voltage $V_{MID}$ defines the middle point of the oscillation. Accordingly, the voltage $V_{MID}$ is usually set to half of the supply voltage of the control unit 20, e.g. VDD/2, to have the maximum range.

Often, the circuit also includes an additional capacitor C1 connected between the pin 202 and ground GND to stabilize the voltage signal VMID, and to provide the current boost required to charge the sensor. In order to analyze the signal at the pin 204 (see, e.g., FIG. 3a), the control unit 20 may include an analog-to-digital converter (ADC) 208 connected to the pin 204 to sample the voltage of the oscillation. Thus, based on the resolution and sampling frequency of the ADC 206, the whole oscillation may be characterized.

FIG. 4 shows an alternative approach in accordance with the prior art. Specifically, in the example considered, the control unit 20 comprises a comparator 210, which compares the voltage at the pin 204 with a reference signal, such as a reference voltage $V_{Ref}$. For example, this reference voltage $V_{Ref}$ may be fixed, e.g. to VDD/2, or set via a digital-to-analog converter 212. For example, FIGS. 5a and 5b respectively show the oscillations with and without a metallic object in the vicinity of the sensor 10, along with a reference voltage $V_{Ref}$ and the output CMP of the comparator 210. Generally speaking, the two approaches shown in FIGS. 3a and 4, i.e., the ADC 208 and comparator 210, may also be combined in the same control unit 20.

Thus, based on the foregoing, contactless motion measurement may be achieved by interfacing LC sensors directly with microcontroller integrated circuits (ICs). Such sensing may be useful, e.g., for metering systems (gas, water, distance, etc.). However, while handling and sampling sensors, microcontrollers (or MCUs) should reduce the power consumption to permit the development of battery-powered systems. Moreover, as MCU units are typically general-purpose, there is also the desire to reduce the silicon area consumption due to the specialized circuits used for the implementation of the above functionality. Thus, in LC sensor excitation and measurement techniques it maybe desirable to reduce consumption and cost, especially for battery powered applications as already mentioned.

Thus, a first problem is related to the use of dedicated low power analog components, e.g., for generating the voltage $V_{MID}$ and the internal reference voltage $V_{Ref}$, which results in a greater cost. A second problem is related to the digital-to-analog converter 210 that is to be both low power and fast enough to follow the damped oscillation. This leads to a significant power consumption per measurement, as well as challenging application constraints in battery-powered systems.

Furthermore, Process-Voltage-Temperature (PVT) variations are another important issue in battery powered systems where there are significant voltage changes. Indeed, the components which were described above could be affected by the PVT variations: sensors (damping factor, frequency, etc.); I/O pads current and resistance (excitation); and the comparator switching point, etc.

SUMMARY

Based upon the foregoing description, an approach is provided which may overcome one or more of previously outlined drawbacks. This may be achieved through a method having the features set forth below. A related system, as well as a corresponding related computer program product, loadable in the memory of at least one computer and including software code portions for performing the steps of the method when the product is run on a computer, are also provided. As used herein, reference to such a computer program product is intended to be equivalent to reference to a computer-readable medium containing instructions for controlling a computer system to coordinate the performance of the method. Reference to "at least one computer" is intended to highlight the possibility for the present embodiments being implemented in a distributed/modular fashion.

As mentioned above, the present description provides approaches for interfacing an LC sensor with a control unit, such as a microcontroller, where the control unit includes first and second contacts (e.g., pins or pads of a microcontroller), and the LC sensor may be connected between the first and the second contacts. In some embodiments, the oscillation of the LC sensor is started by driving the two contacts, and the voltage at the second contact is monitored. In this case, the voltage at the second contact corresponds to the sum of the voltage at the first contact and the voltage at the LC sensor.

In some embodiments, the voltage at the first contact is varied, such that the voltage at the second contact (i.e., the sum of the voltage at the first contact and the voltage at the LC sensor) does not exceed an upper voltage threshold and does not fall below a lower voltage threshold. For example, the voltage at the first contact may be varied by generating a counter-oscillation at the first contact, where the counter-oscillation is phase shifted with respect to the oscillation of the LC sensor. By way of example, in some embodiments the voltage at the first contact may be varied by decreasing the voltage at the first contact when the voltage at the second contact reaches the upper voltage threshold, and/or increasing the voltage at the first contact when the voltage at the second contact reaches the lower voltage threshold.

In some embodiments, the control unit may include a clamping circuit defining the upper voltage threshold and the lower voltage threshold. For example, the clamping circuit may include a first diode connected between the second contact and a supply voltage, and a second diode connected between a ground and the second contact.

In addition, a capacitor may be connected between the first contact and ground. In this case, the oscillation may be started and the voltage at the second contact may be limited automatically through three phases. For example, during the first phase the capacitor may be discharged, e.g., by connecting the first contact to ground. During the second phase, the first contact may be connected to ground and the second contact may be connected to the supply voltage, where the LC sensor is charged through the supply voltage provided at the second contact. During the third phase, the first contact and the second contact are placed in a high impedance state (e.g., disconnected) such that the LC sensor is able to oscillate. In this embodiment, the voltage at the second contact is limited by charging or discharging the capacitor through the clamping circuit.

In some embodiments, during the first phase the first contact may be connected to the supply voltage so that the capacitor is charged. During the second phase, the first contact is connected to the supply voltage and the second contact is connected to ground, thus the LC sensor is charged through the supply voltage provided at the first contact. During the third phase, the first contact and the second contact are placed in a high impedance state such that the LC sensor is able to oscillate. Accordingly, in this embodiment the oscillation occurs in the opposite direction, but the voltage at the second contact is also limited by charging or discharging the capacitor through the clamping circuit.

In some embodiments, the duration of the second phase (i.e., the charge phase of the LC sensor), may be controlled to regulate the amplitude of the oscillation of the LC sensor at the beginning of the third phase.

BRIEF DESCRIPTION OF THE DRAWINGS

Embodiments of the present disclosure will now be described with reference to the attached drawings, which are provided by way of non-limiting example, and in which:

FIG. 3b is a graph of voltage vs. time for the LC sensor of FIG. 3a;

FIG. 4 is a schematic diagram of an LC sensor in accordance with a prior art configuration;

FIGS. 5a and 5b are graphs of voltage vs. time for the LC sensor of FIG. 4 with and without a metallic object in the vicinity of the sensor, respectively;

DETAILED DESCRIPTION

In the following description, numerous specific details are given to provide a thorough understanding of embodiments. The embodiments may be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments. In the following FIGS. 6 to 19, parts, elements or components which have already been described with reference to FIGS. 1 to 5 are denoted by the same references previously used in such figures. The description of such previously described elements will not be repeated below so as not to overburden the present detailed description.

Figure 1:
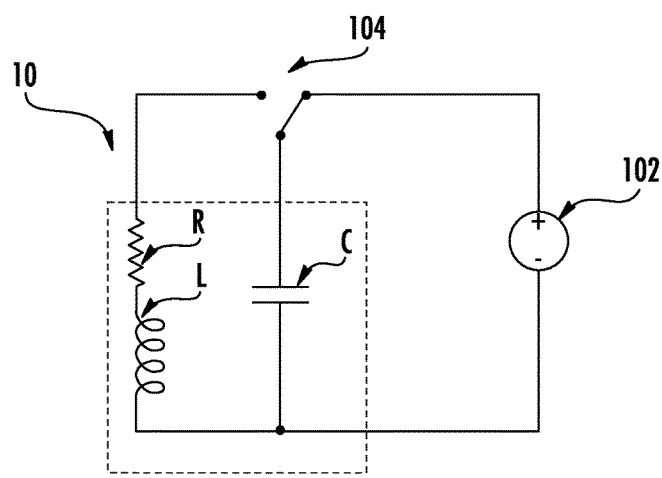
FIG. 1 is a schematic diagram of an LC sensor in accordance with a prior art configuration.
Figure 2A:
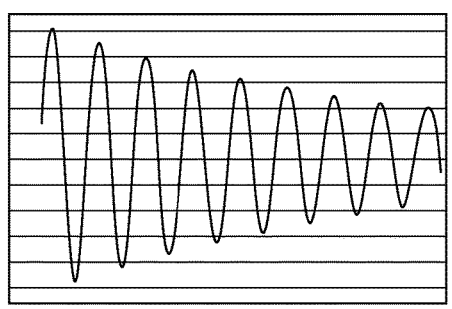
FIGS. 2a and 2b are graphs of voltage vs. time for the LC sensor of FIG. 1 without and with a metallic object in the vicinity of the sensor, respectively.
Figure 2B:
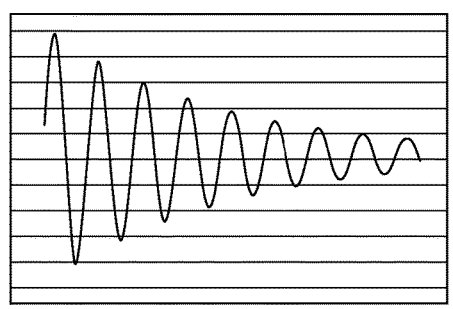
Figure 3A:
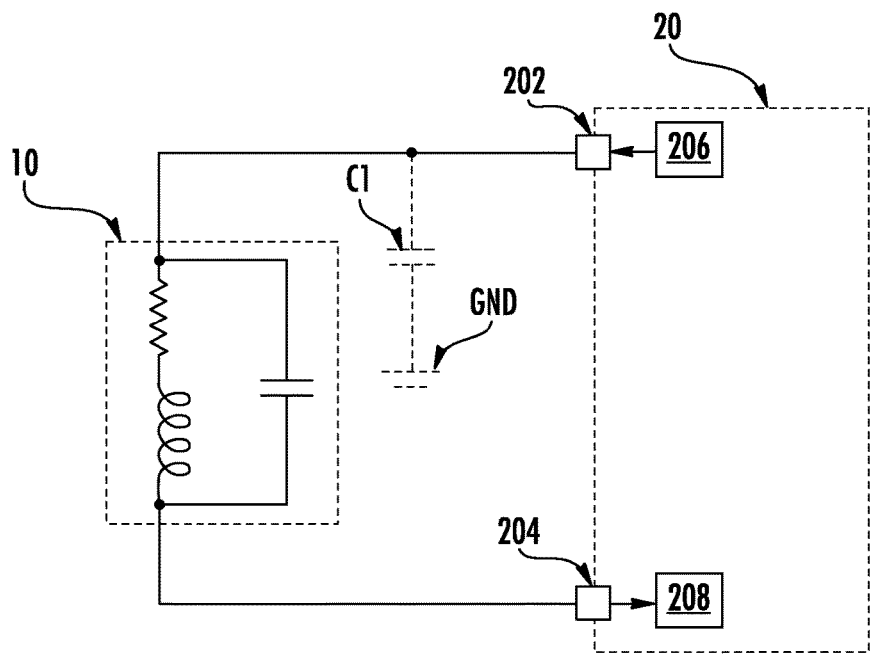
FIG. 3a is a schematic diagram of an LC sensor in accordance with a prior art configuration.
Figure 3B:
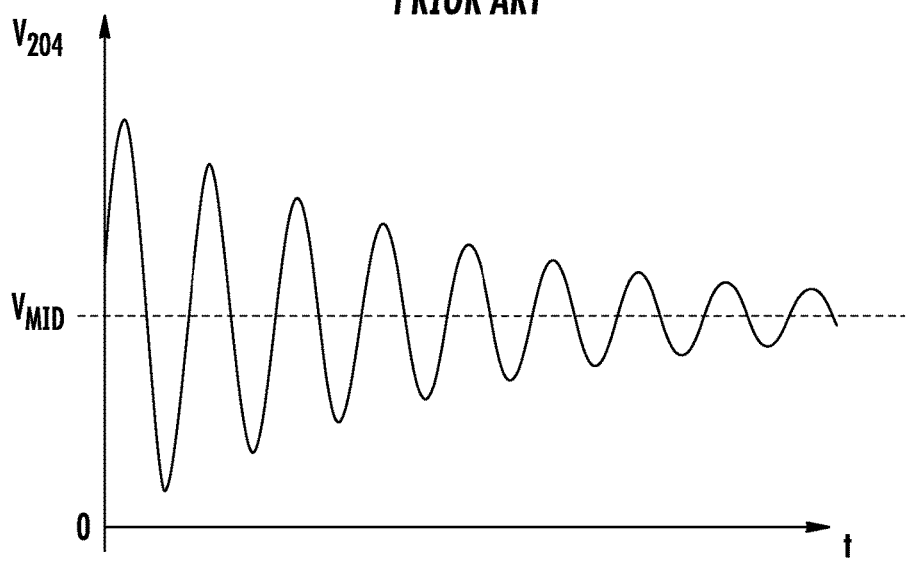

The inventors have observed that the approaches described with respect to FIGS. 3a and 4, i.e., using a fixed voltage source to generate the middle point voltage $V_{MID}$ of the oscillation, exhibit a significant disadvantage. More specifically, as noted above, in these approaches the pin 202 is always connected to the voltage source 206, which imposes the voltage $V_{MID}$ at the pin 202, and the pin 204 is connected for a short period of time to ground GND to start the oscillation.

Accordingly, during this charge phase, the sensor 10 is connected between the voltage $V_{MID}$ and to ground GND. Basically, if the charge time is sufficiently short, the inductor L of the sensor 10 may be assumed open, and at the end of the charge phase the capacitor C is charged at most to the voltage $V_{MID}$. However, it will be appreciated that the charge transfer is indeed not "instantaneous", e.g., due to resistive loads between the source 206 and the capacitor C, and the inductor L cannot be assumed always open during the charge time.

Figure 6:
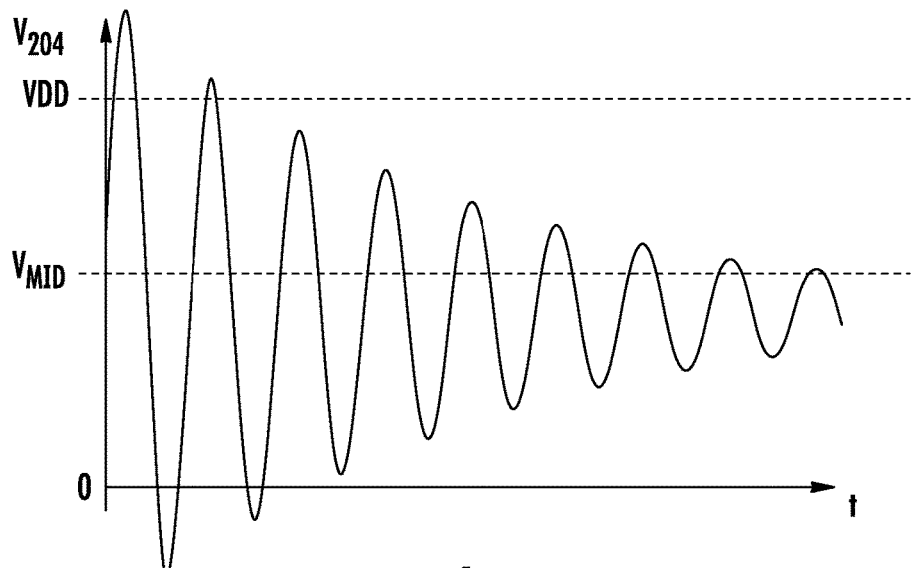
FIGS. 6 and 8 are graphs of voltage vs. time for the configuration of FIG. 7.

Accordingly, when the pin 204 is connected to ground GND, current flows through the inductor L and the inductor stores some energy by generating a magnetic field. Conversely, when the pin 204 is disconnected, this energy will be transferred to the capacitor C as in a conventional LC resonant circuit. However, this additional energy stored in the inductor L may cause significant voltage variation. For example, as shown in FIG. 6, in case the voltage $V_{MID}$ corresponds to half of the supply voltage VDD of the control circuit 20, the voltage $V_{204}$ at the pin 204 may exceed the supply voltage VDD and fall below zero.

Figure 7:
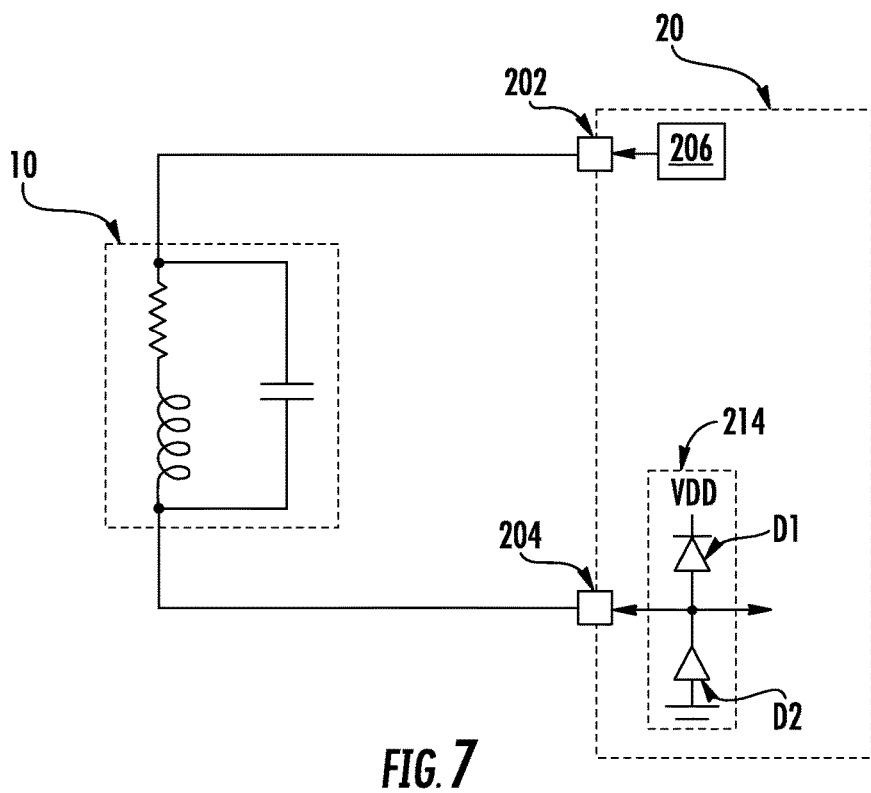
FIG. 7 is schematic diagram of clamping circuits interfacing an LC sensor.

In typical digital circuits, this problem is avoided by using pad protection circuits 214. For example, as shown in FIG. 7, usually such protection circuits 214 include two clamping diodes D1 and D2 which are connected respectively to the supply voltage VDD and ground GND. In particular, as shown in FIG. 7, pin 204 may have associated therewith a first diode D1 with the anode connected to pin 204 and the cathode connected to the supply voltage VDD, and a second diode D2 may have its anode connected to ground GND and its cathode connected to pin 204. Accordingly, in this case, a voltage at the pin 204, exceeding the supply voltage VDD is discharged through the diode D1, and a negative voltage at the pin 204 is discharged through the diode D2.

Figure 8:
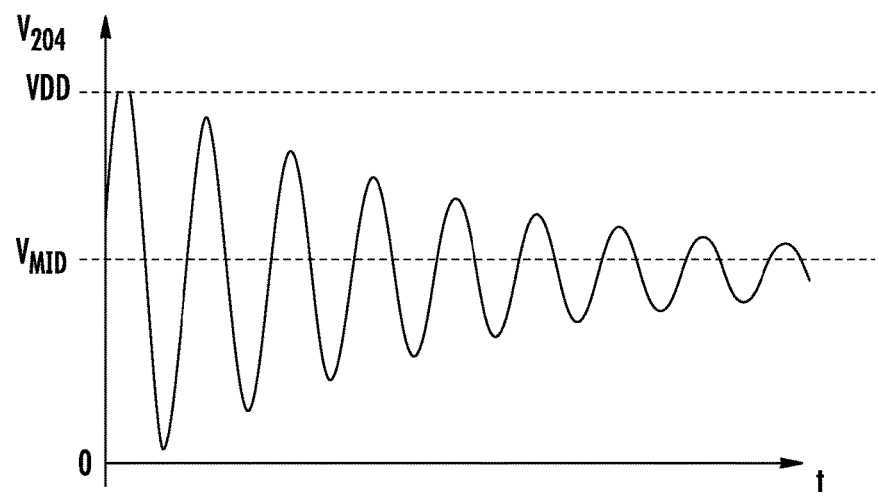

FIG. 8 shows in that respect a waveform of the oscillation in the presence of such a protection circuit 214 at the pin 204. More specifically, in the present example, once the voltage at the pin reaches the supply voltage VDD, or more precisely a voltage corresponding to the sum of the supply voltage VDD and the forward voltage of the diode D1, the voltage is limited and the respective energy is discharged to the supply voltage VDD. Accordingly, due to the fact that the respective energy is removed from the resonant circuit, the oscillation continues directly with the reduced amplitude corresponding to VDD-$V_{MID}$, e.g., VDD/2.

The inventors have observed that this lost energy negatively influences the resolution of the measurement. For example, this may be the case if the LC sensor has a high damping factor and only a small number of oscillations occur, and accordingly only a small number of pulses would be available in the comparison signal shown, e.g., in FIGS. 5a and 5b. In this case, to have a higher resolution, it would be helpful to increase the energy transferred to the LC sensor to generate more impulses in the comparison signal. However, once the clamping circuit intervenes, the additional energy is lost and the resolution may not be improved further.

Similarly, small variations of the damping factor may also be hard to detect. In fact, in this case it would be helpful to increase the energy transferred to the LC sensor to generate more impulses in the comparison signal, thus generating a different numbers of impulses for small variations of the damping factor. However, once the clamping circuit intervenes, the additional energy is lost and the resolution may not be improved further. Moreover, similar problems exist in case the oscillation is monitored with an analog-to-digital converter, because the energy which may be monitored generally corresponds to the energy stored in the LC sensor minus the energy lost in the clamping circuit.

The inventors have observed that the voltage $V_{204}$ at the measurement pin or line 204 corresponds to:

$$V_{204}(t)=V_{LC}(t)+V_{MID}(t) \qquad (1)$$

where $V_{LC}$ is the voltage at the LC sensor 10. Accordingly, in some embodiments, the voltage $V_{204}$ is limited by varying $V_{MID}$ in case the voltage $V_{204}$ exceeds given threshold values.

Figure 9:
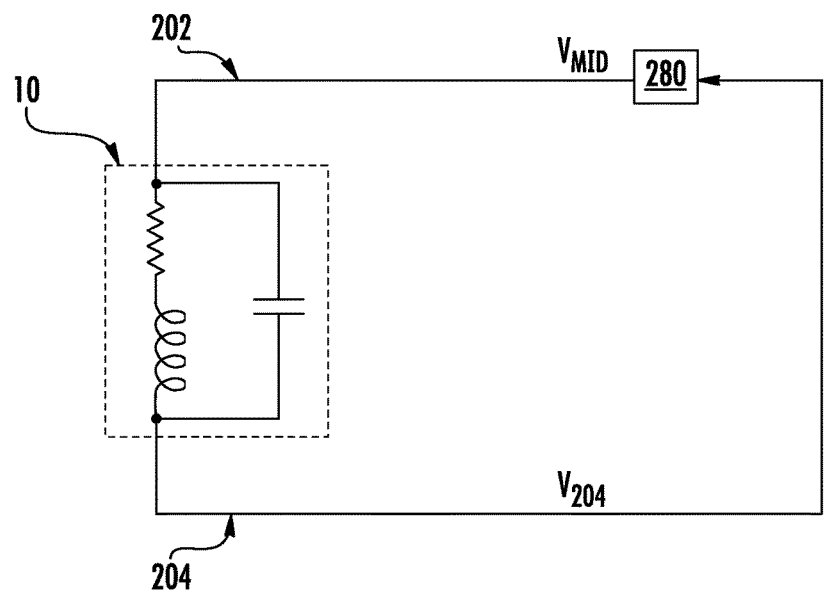
FIG. 9 is a schematic diagram of a first embodiment of a system for interfacing an LC sensor in accordance with an example embodiment.

FIG. 9 shows an embodiment in accordance with an example embodiment in which a variable voltage source 280 is used to regulate the voltage $V_{MID}$ on the line 202. In the illustrated embodiment, a closed loop is used to regulate the voltage $V_{MID}$ to help ensure that the voltage $V_{204}$ at the measurement line 204 remains between a lower threshold voltage VL and an upper threshold voltage VH, for example, VL=0 and VH=VDD.

Figure 10:
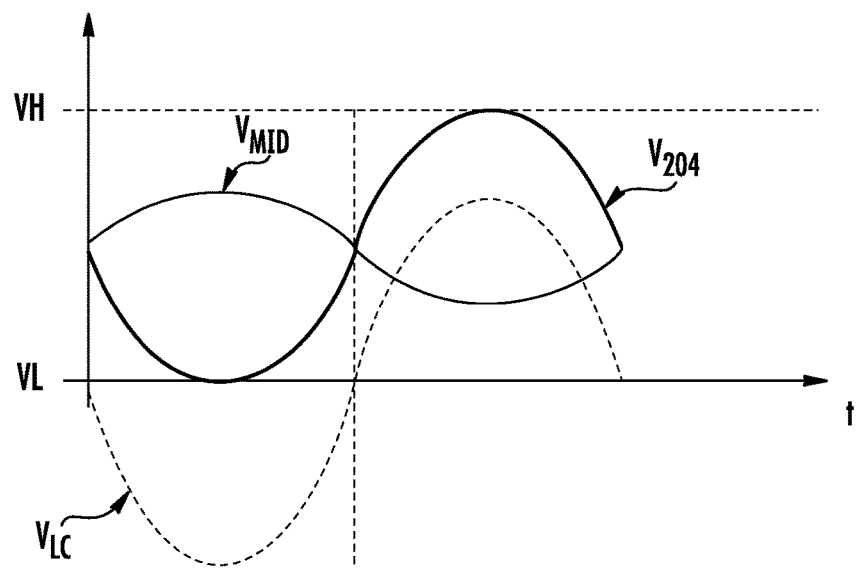
FIGS. 10-12 show exemplary waveforms which may occur in the system of FIG. 9.

FIG. 10 illustrates an embodiment where the voltage source 280 is configured for generating a voltage $V_{MID}$, which corresponds to an opposite oscillation with respect to the oscillation produced by the LC sensor 10, e.g., a sinusoidal oscillation having a phase shift of 180°. In this case, the oscillation of the voltage $V_{MID}$ may also have a DC offset, e.g., (VH−VL)/2. For example, in some embodiments, the amplitude of the oscillation of $V_{MID}$ corresponds to or is at least:

$$A_{VMID}=A_{VLC}-(VH-VL)/2, \qquad (2)$$

where $A_{VLC}$ is the amplitude of the oscillation of the voltage $V_{LC}$.

Instead of producing such a sinusoidal counter oscillation of the voltage $V_{MID}$, in some embodiments the voltage source 280 is configured as follows. Once the voltage $V_{204}$ reaches the upper threshold voltage VH, the voltage $V_{MID}$ is reduced at the line 204 such that the voltage $V_{204}$ does not exceed the upper threshold voltage VH. Moreover, once the voltage $V_{204}$ reaches the lower threshold voltage VL, the voltage $V_{MID}$ at the line 204 is increased such that the voltage $V_{204}$ does not fall below the lower threshold voltage VL.

Figure 11:
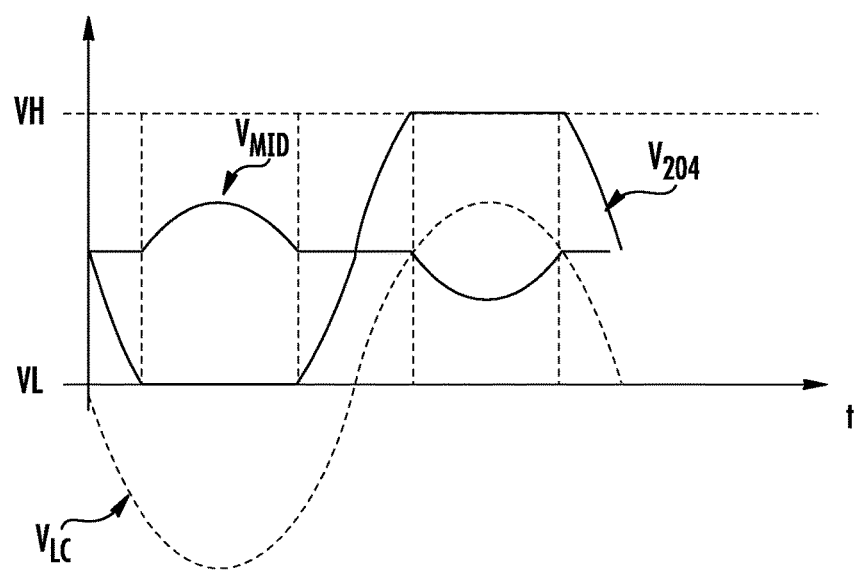

Accordingly, in this embodiment a kind of counter oscillation is also produced, which is synchronized with the time instants in which the voltage $V_{204}$ reaches the thresholds VH and VL. For example, FIG. 11 shows an embodiment in which the voltage $V_{MID}$ usually has a default value, such as (VH−VL)/2, e.g., VDD/2, and in which the voltage source 280 is configured for increasing or decreasing this default value when the voltage $V_{204}$ reaches the lower or upper threshold, respectively. More specifically, in the embodiment shown in FIG. 11, the voltage source 280 is configured to return back to the default value as soon as possible.

Figure 12:
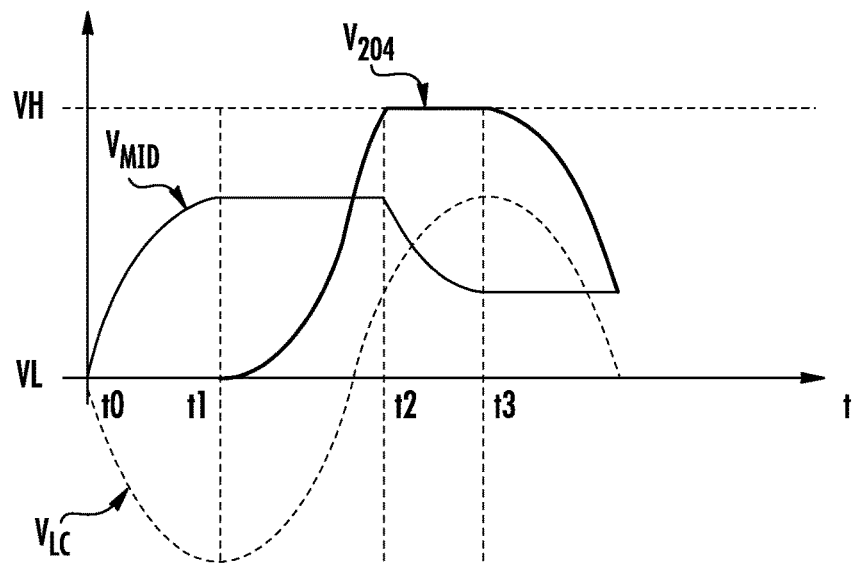

Conversely, FIG. 12 shows an embodiment in which the voltage source 280 is configured for merely intervening when compensation of the voltage $V_{204}$ is required, without having any specific reference value for the voltage $V_{MID}$. For example, as shown in FIG. 12, the voltage $V_{MID}$ has a given value and an oscillation is started at a time t0. For example, in the example considered, the voltage $V_{MID}$ is equal to 0, which may also correspond to the lower threshold voltage VL. Moreover, in the present example it is assumed that the oscillation has a negative transition.

Accordingly, during this phase (t0-t1), the voltage source 280 maintains the voltage $V_{204}$ at the lower threshold VL:

$$V_{204}(t)=VL, \quad (3)$$

by increasing the voltage as follows:

$$V_{MID}(t)=VL-V_{LC}(t). \quad (4)$$

At a time t1, the oscillation reaches its minimum and the voltage $V_{LC}$ begins to increase. Accordingly, no further compensation of the voltage $V_{MID}$ is required. For example, in the embodiment considered, the voltage at line 202 remains during the following phase (t1-t2), at the level reached at the time t1:

$$V_{MID}(t)=V_{MID,t1}, \quad (5)$$

while the voltage $V_{204}$ at the measurement line 204 increases following the oscillation of the LC sensor:

$$V_{204}(t)=V_{LC}(t)+V_{MID,t1}, \quad (6)$$

until the voltage $V_{204}$ reaches the upper threshold voltage VH at a time t2.

At this moment, the voltage source 280 again compensates the voltage $V_{MID}$. More specifically, in the embodiment considered, during this phase (t2-t3) the voltage source 280 maintains the voltage $V_{204}$ at the upper threshold VH:

$$V_{204}(t)=VH, \quad (7)$$

by decreasing the previous voltage $V_{MID}$ as follows:

$$V_{MID}(t)=VH-V_{LC}(t). \quad (8)$$

Finally, at a time t3, the oscillation reaches its maximum and the voltage $V_{LC}$ begins to decrease.

Accordingly, no further compensation of the voltage $V_{MID}$ may be required. For example, in the embodiment considered, the voltage at line 202 remains during the following phase (>t3), at the level reached at the time t3:

$$V_{MID}(t)=V_{MID,t3}, \quad (9)$$

while the voltage $V_{204}$ at the measurement line 204 decreases following the oscillation of the LC sensor 10:

$$V_{204}(t)=V_{LC}(t)+V_{MID,t3}, \quad (10)$$

Accordingly, in the embodiment considered, the voltage at the measurement line 204 is compensated by the voltage $V_{MID}$.

Usually, both the voltage at the measurement line 204 and the voltage $V_{MID}$ may vary between 0 and VDD. Accordingly, by using the described compensation techniques, oscillations of the LC sensor 10 with an amplitude of VDD are supported, while prior-art approaches were limited substantially to VDD/2.

Generally speaking, any circuit adapted to vary the voltage $V_{MID}$ at the line 202 as a function of the voltage at the line 204 may be used for the block 280. For example, in some embodiments, the circuit 280 may include an analog-to-digital converter which measures the voltage $V_{204}$ at the line 204. As another example, comparators may also be used which compare the voltage $V_{204}$ at the line 204 with the threshold values VH and VL.

In some embodiments, to drive the line 202 the circuit 280 may include a digital-to-analog converter which directly drives the line 202 with a voltage, e.g., as shown in FIGS. 10, 11 and 12. In accordance with another approach, the circuit 280 may include an active pull-up and/or pull-down to set the line 202 to a given high or low voltage, respectively.

Figure 13:
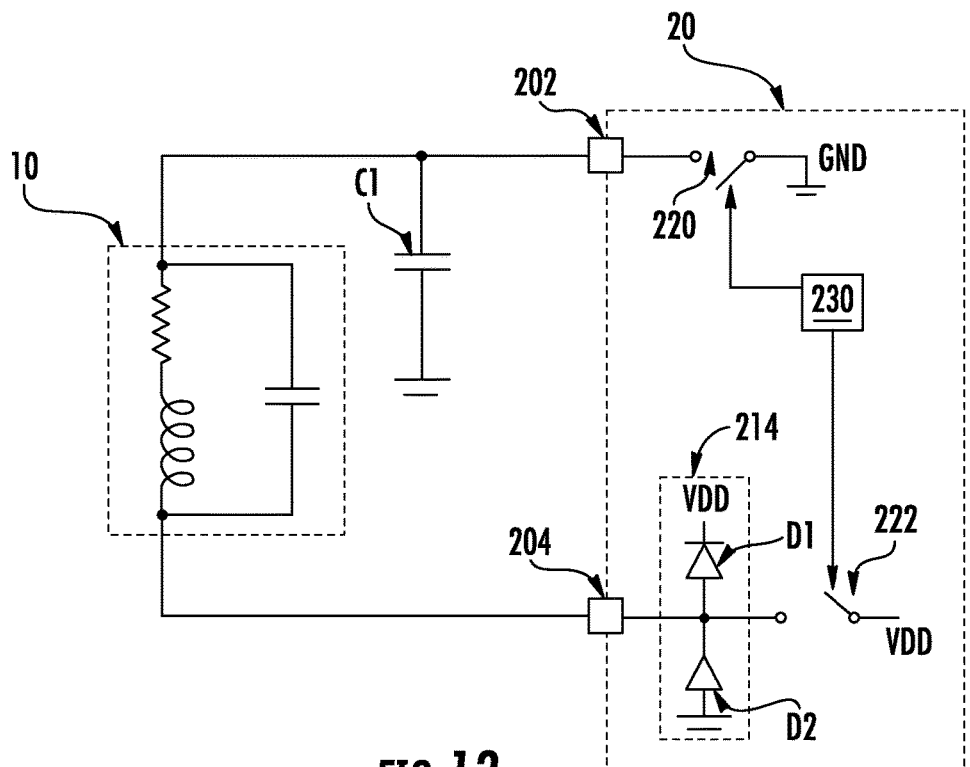
FIGS. 13, 16a, and 16b are schematic diagrams of a second embodiment of a system for interfacing an LC sensor.
Figure 14:
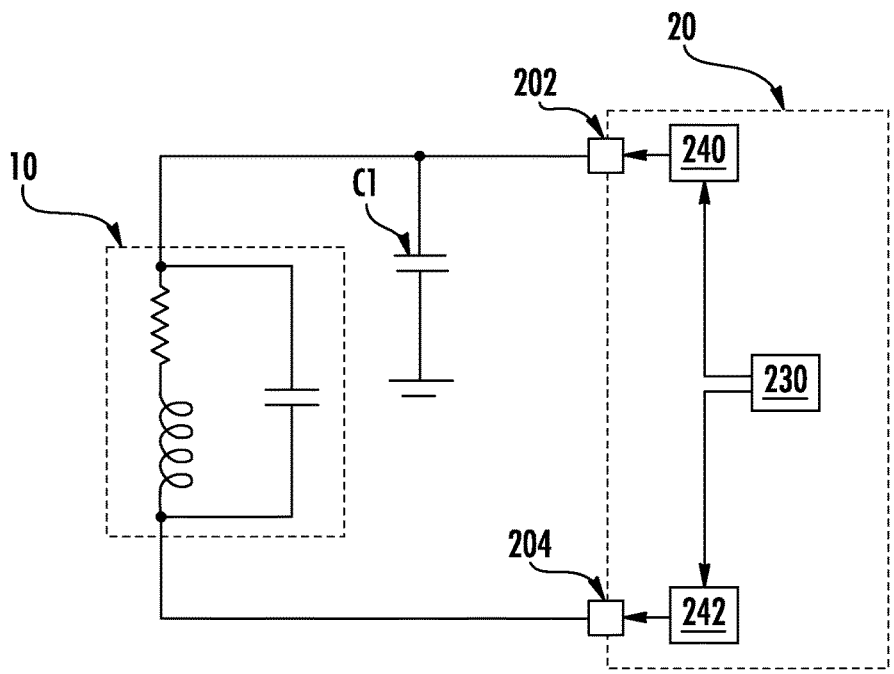
FIGS. 14 and 17-19 are schematic diagrams of additional example embodiments of systems for interfacing an LC sensor.

Instead of performing such a direct digital control, the circuit 280 may also include analog components, which automatically regulate the voltage at the line 202. For example, FIG. 13 shows an embodiment of a circuit adapted to vary the voltage $V_{MID}$ through a capacitor and a clamping circuit. More specifically, in the embodiment considered, the LC sensor 10 is again connected (e.g., directly) between the pins 202 and 204 of the control unit 20, such as a microcontroller. Moreover, a capacitor C1 is connected (e.g., directly) between the pin 202 and ground GND. As will be described below, this capacitor C1 is used in a different manner as compared to the prior-art approaches described with respect to FIGS. 3b and 4.

In the embodiment considered, the control unit 20 does not include a dedicated DAC for generating the voltage $V_{MID}$, but the control unit 20 merely includes a switch 220 configured to connect the pin 202 selectively to ground GND. Accordingly, the pin 202 may be either floating or connected to ground GND. For example, in some embodiments, the operation of the switch 202 may be implemented with conventional three state driver circuitry, e.g., "1" for VDD, "0" for GND and "Z" for a high impedance state, which is often used for output pins of microcontrollers or other digital integrated circuits.

In the embodiment considered, the control unit 20 further includes switch 222 configured to selectively connect the pin 204 a fixed voltage, such as the supply voltage VDD of the control unit 20 or a voltage signal provided by an internal voltage reference generator, which is often available in conventional microcontrollers. Generally, the supply voltage VDD may be received via a power supply pin of the control unit 20 (not shown). Thus, operation of the switch 222 may also be implemented with the conventional driver circuitry of an output pin of a microcontroller.

In the embodiment considered, switching of the switches 220 and 222 is controlled by a processor or processing unit 230, such as a digital processing unit programmed via software instructions, such as the central processing unit (CPU) of a microcontroller. Also in the example embodiment, the pad 204 has associated therewith two clamping diodes D1 and D2. More specifically, the first diode D1 has the anode connected to pin 204, and the cathode is connected to the supply voltage VDD. The second diode D2 has the anode connected to ground GND, and the cathode connected to pin 204. Generally speaking, such clamping/protection diodes D1 and D2 are often used for the protection of driving/sensing circuits in integrated circuits and may be integrated, e.g., in conventional three state driving circuits.

Figure 15:
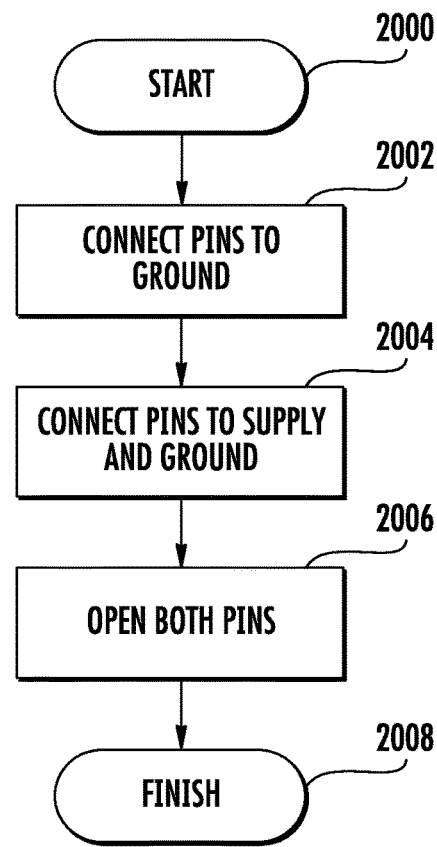
FIG. 15 is flow chart of a method which may be used for driving the system of FIGS. 13, 16a, and 16b.

Accordingly, in some embodiments (see, e.g., FIG. 14), the above-described driving of the pads 202 and 204 may be implemented with conventional three state driving circuits 240 and 242, e.g., of a microcontroller 20. FIG. 15 shows a flow chart of the main operations performed by the control unit 20 to start an oscillation of the LC sensor 10. After a start step 2000, the control unit 20 connects the pin 202 and the pin 204 to ground GND in a step 2002. For example, the processing unit 230 may drive the pins 202 and 204 with the logic level "0". Accordingly, this condition corresponds to a reset condition and the sensor 10 and the capacitor C1 are discharged.

Generally speaking, it may also be sufficient to only discharge the capacitor C1, because after longer periods of time, the LC sensor is usually already discharged. For example, in this case, it may be sufficient to merely connect the capacitor C1 via the pin 202 to GND, while the pin 204 may also be floating.

Next, the control unit 20 connects in a step 2004 the pin 204 to a supply signal, such as the voltage VDD, and the pin 202 to ground GND. For example, the processing unit 230 may drive the pin 202 with the logic level "0" and the pin 204 with the logic level "1". Accordingly, in the step 2004, the capacitor C1 is still connected to ground, while the LC sensor 10 is connected between VDD and GND. As such, during this phase the LC sensor 10 is charged.

The control unit 20 may then open both pins 202 and 204 in a step 2006, i.e., both pins 202 and 204 are floating. For example, the processing unit 230 may drive both the pin 202 and the pin 204 with the logic level "Z". Accordingly, due to the fact that the LC sensor 10 has been charged during the step 2004, the LC resonant circuit 10 starts to oscillate in the step 2006. Finally, the procedure terminates at a step 2008.

This circuit operations is shown in FIG. 12. Indeed, at the beginning of the step 2006 (time t0), the capacitor C1 is discharged, i.e., the voltage $V_{MID}$ corresponds to zero. Moreover, due to the charge direction, the voltage $V_{LC}$ starts with a negative transition, because the current continues to flow through the inductor L of the LC sensor 10. In this case (as shown also in FIG. 16a), the current flow is closed via the diode D2, and the capacitor C1 is accordingly charged, thus increasing the voltage $V_{MID}$.

Once the current in the inductor L becomes zero, the oscillation direction is changed. In this case, the pin 204 is in a high impedance state, and the oscillation occurs only between the L and C components of the sensor 10 and the voltage $V_{MID}$ at the capacitor C1 remains stable (see period t1-t2 of FIG. 12).

In case the amplitude $V_{osc,max}$ of the oscillation is small, i.e. $V_{LC,max}$<VDD/2, the oscillation will continue in the usual manner, in which the voltage $V_{MID}$ at the time t1 is the middle point corresponding approximately to $V_{LC,max}/2$. Conversely, as shown at the time t2 in FIG. 12, when the amplitude is high and the upper threshold VH is reached (which in the embodiment considered corresponds to the sum of VDD and the forward voltage of the diode D1), the diode D1 intervenes. Accordingly, in this case the capacitor C1 discharges through the diode D1, thus reducing the voltage $V_{MID}$.

Again, once the current through the inductor L becomes zero and the oscillation direction is inverted (time t3 in FIG. 12), the pin 204 is again in a high impedance state, and the oscillation occurs only between the L and C components of the sensor 10 and the voltage $V_{MID}$ at the capacitor C1 remains stable (>t3 of FIG. 12). In the example embodiment, the charging and discharging of the capacitor will continue as long as the amplitude of the oscillation is greater than VDD/2, i.e., (VH−VL)/2, and the voltage $V_{MID}$ will also tend to VDD/2, i.e., (VH−VL)/2.

In another example embodiment, the steps 2002 and 2004 of the above method may be modified by pre-charging the capacitor C1 to the supply voltage, e.g., VDD. For this purpose, the control unit 20 may connect the pin 202 and the pin 204 to the supply signal in the step 2002, e.g., VDD. For example, the processing unit 230 may drive the pins 202 and 204 with the logic level "1".

Accordingly, this condition corresponds to a reset condition, and the LC sensor 10 is discharged and the capacitor C1 is charged to the supply voltage. Generally speaking, the step 2002 may in this case also be divided into two sub-steps: a first step for discharging the LC sensor 10 and the capacitor C1; and a second step for charging the capacitor C1. Again, the discharging of the LC sensor is purely optional and it may be sufficient to merely connect the capacitor C1 via the pin 202 to VDD, while the pin 204 may also be floating.

Next, in the step 2004 the control unit 20 connects the pin 202 to a supply signal, such as the voltage VDD, and the pin 204 to ground GND. For example, the processing unit 230 may drive the pin 202 with the logic level "1" and the pin 204 with the logic level "0". Accordingly, in the step 2004, the capacitor C1 is connected still to VDD, while the LC sensor 10 is connected between VDD and GND, i.e., also the LC sensor 10 is charged.

Next, the control unit 20 opens both pins 202 and 204 in a step 2006, i.e., both pins 202 and 204 are floating. For example, the processing unit 230 may drive both the pin 202 and the pin 204 with the logic level "Z". Accordingly, due to the fact that the LC sensor 10 has been charged during the step 2004, the LC resonant circuit 10 starts to oscillate in the step 2006.

However, in this case, the complete oscillation occurs in the opposite direction. For example, due to the charge direction, the voltage $V_{LC}$ starts with a positive transition, because the current continues to flow through the inductor L of the LC sensor 10. In this case, the current flow is closed via the diode D1, and the capacitor C1 accordingly is discharged, thus decreasing the voltage $V_{MID}$.

Thus, if the capacitor C1 is (initially) discharged, the LC sensor 10 should be charged by connecting the pin 204 to the supply voltage and pin 202 to ground GND. On the contrary, if the capacitor C1 is (initially) charged, the LC sensor 10 should be charged by connecting the pin 202 to the supply voltage and pin 204 to ground GND.

Figure 16A:
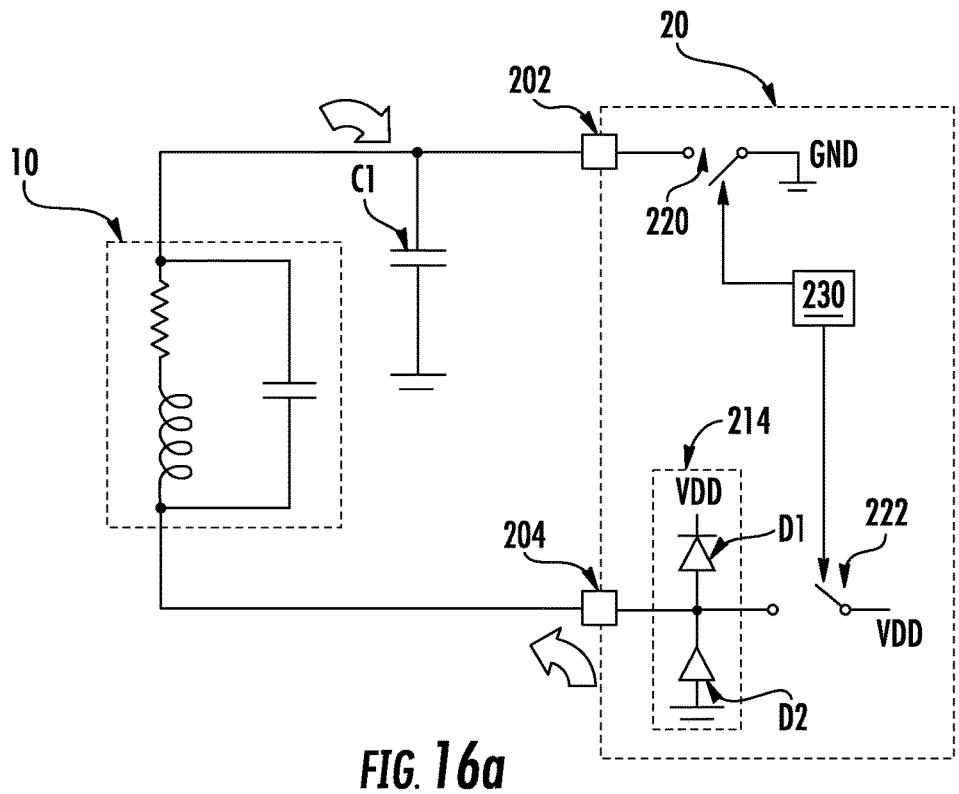
Figure 16B:
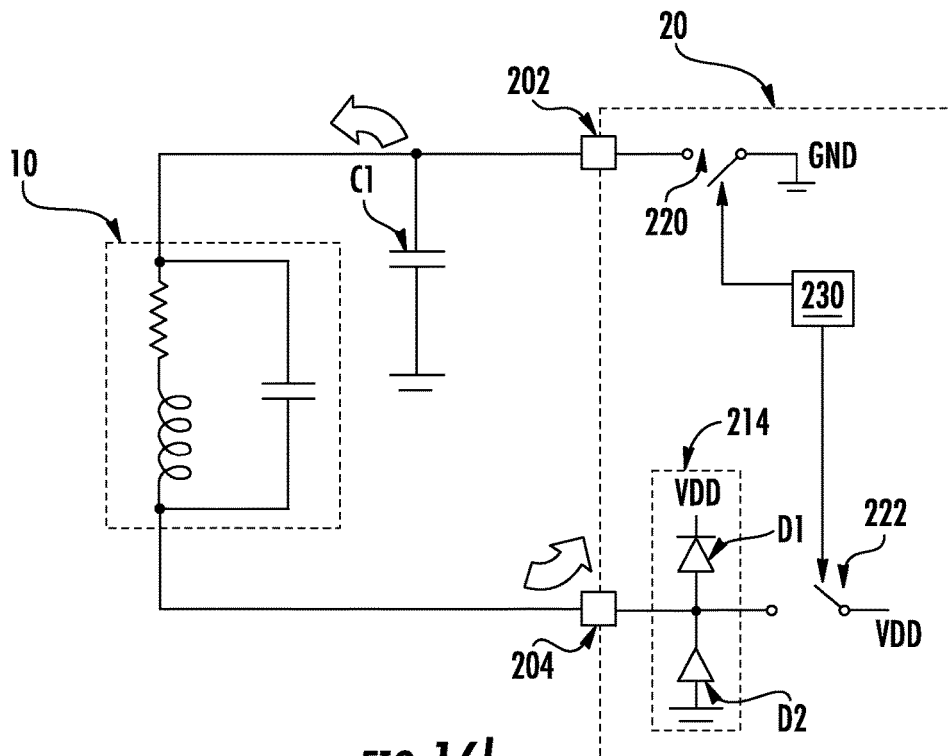

However, the capacitor C1 may also initially be charged during the first phase 2002 to different values (between 0V and VDD), and/or the charge direction of the LC sensor 10 during the second phase 2004 also is not particularly relevant, because as shown in FIGS. 16a and 16b the circuit will adapt itself. Generally speaking, the amplitude of the oscillation depends on the amount of charge transferred during the step 2004, which in turn depends on the excitation time, in which the LC sensor is connected between VDD and GND, i.e., the duration of the step 2004.

In certain conditions the current produced by the inductor L may charge or discharge the capacitor C1 too much, i.e., the voltage $V_{MID}$ may also reach an upper or lower threshold voltage. To avoid this problem, a clamping circuit 214 may also be used for the pin 202. In any event, as mentioned above, when using the input/output pads of a microcontroller such clamping circuits are often already implemented.

The above description is applicable to a single sensor 10. However, the system may also be extended to multiple sensors, e.g., by using a single pad 202 and a respective sensing pad 204 for each LC sensor. Generally speaking, the signal at the pin 204 may be analyzed as in the prior art approaches described with respect to FIGS. 3b and 4, e.g., via a comparator or and analog-to-digital converter.

Figure 17:
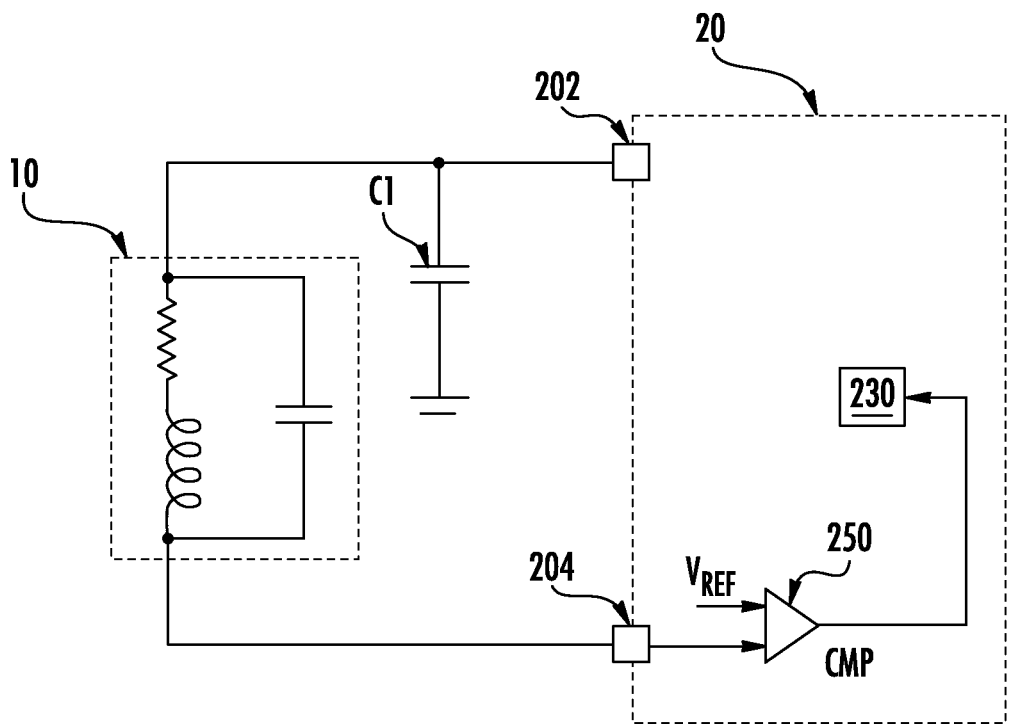

By way of example, as shown in FIG. 17, a comparator 250 may be connected to the pin 204 and compare the voltage at the pin 204 with a reference value $V_{Ref}$, which may also be fixed. The result of the comparison CMP may then be made available to the processing unit 230, e.g., the digital processing core of a microcontroller, which may be configured for analyzing the sequence of pulses in the signal CMP.

For example, in some embodiments, a comparator with hysteresis, such as a Schmitt Trigger, with fixed thresholds may be used to analyze the oscillation. Such Schmitt Triggers with fixed thresholds are often used in the sensing circuitry of the input pads of microcontrollers or other digital integrated circuits. Accordingly, no additional components may be required, and the conventional sensing circuitry of an input pin of microcontroller may be used.

Figure 18:
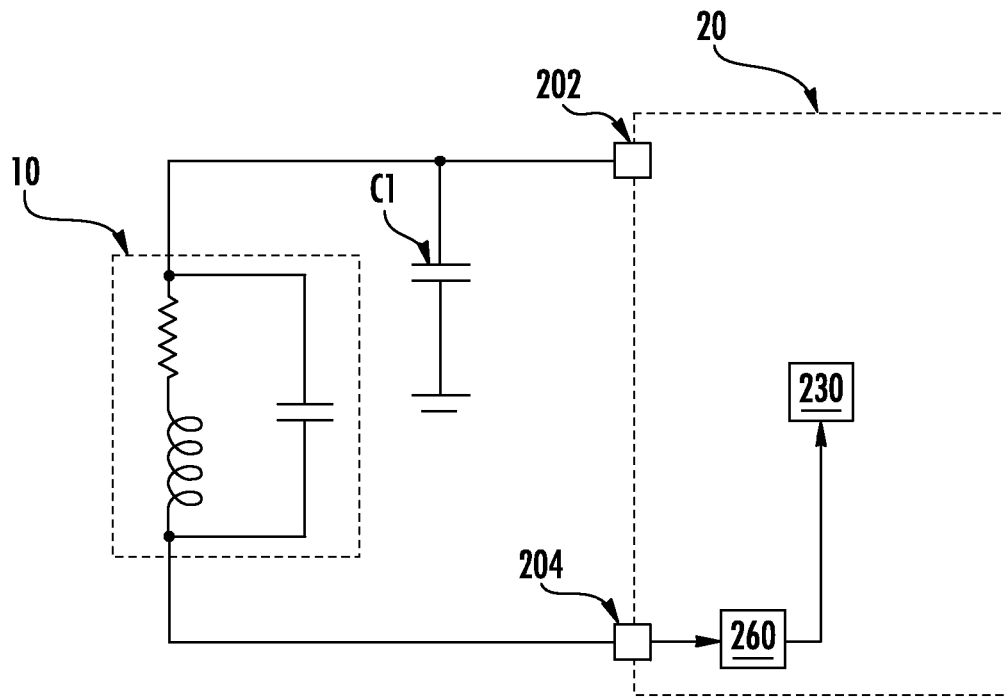

For example, as shown in FIG. 18, the conventional sensing circuitry 260 of an input pad, e.g., of a microcontroller, may be used to implement the comparator 250. Accordingly, the result of the comparison may be directly available to the processing core 230 by merely "reading" the value associated with the input pad 204.

Figure 19:
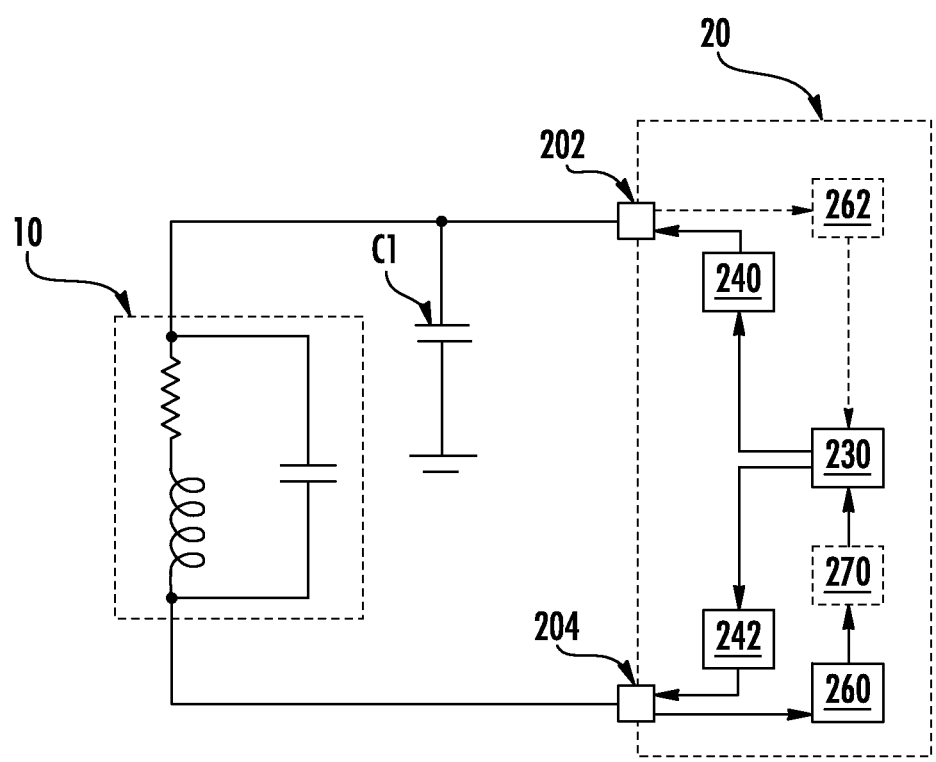

In this context, FIG. 19 shows an embodiment of an integrated circuit 20, such as a microcontroller, which may be used to perform the above operations. More specifically, in the embodiments considered, pad 204 is an input and output pad with the associated three state output drive circuitry 242 and input sensing circuitry 260, such as a Schmitt Trigger, in which either the circuit 242 or the circuit 260 includes the protection circuit 214 with the clamping diodes D1 and D2. Pad 202 is at least an output pad with the associated three state output drive circuitry 240.

Accordingly, by driving the pads 202 and 204 via the driver circuitry 240 and 242 as described above, in particular with respect to FIG. 15, the oscillation of the LC sensor 10 may be stimulated and the middle point voltage $V_{MID}$ will be regulated automatically via the capacitor C1 and the clamping diodes D1/D2. For example, the driving of the pads 202 and 204 to start the oscillation may be performed via the digital processing core 230.

Once the oscillation has been started, the output from the sensing circuitry 260 is fed to the processing core 230 for further analysis to determine characteristics of the oscillation. For example, as shown with respect to FIGS. 5a and 5b, the output CMP is indicative for the damping factor of the oscillation, which in turn is indicative for the presence of a metallic object near the sensor 10.

In some embodiments, the control unit 20 may also analyze the voltage $V_{MID}$ at the pin 202, e.g., via a comparator and/or an analog-to-digital converter. For example, in the embodiment considered the pad 202 also has associated and input sensing circuitry 262 for this reason. Generally speaking, the digital processing unit 230 may be a dedicated hardware module, a general purpose processor programmed via software instructions, or a combination of both.

Thus, the counting of the pulses in the signal CMP may also be performed via the digital processing core. However, the oscillation may usually have a high frequency and a counting via software instructions may not be feasible. Accordingly, in this case, the control unit 20 may include a hardware implemented counter 270, which may already be included in conventional microcontrollers, and the output of the sensing circuitry 260 may be fed to this counter 270. Thus, this counter 270 may count the number of pulses in the signal CMP independently from the processing unit 230, and the processing unit 230 may read the final result, i.e., the signal at the output of the counter 270, and eventually reset the counter 270 when a new measurement is started.

Moreover, the counter 270 may also be replaced by or extended to a dedicated measurement and processing unit which directly elaborates the signal CMP to extract the information required. For example, the measurement and processing unit 270 may directly detect the sensor's state, such as over metal, over plastic, etc. The module 270 may also generate at least one programmable interrupt on specific conditions. For example, such a measurement and processing unit may also be connected to a plurality of sensing pads 204 to elaborate the signal from a plurality of sensors, e.g. to perform a speed or rotation measurement.

As mentioned above, the number of oscillations and thus the number of pulses at the output of the comparator 250/260 varies for the same LC sensor's state as a function of the excitation time of phase 2004, while in prior art approaches only a saturation effect was obtained for longer durations. Accordingly, in some embodiments, the control unit may monitor the number of digital pulses generated at the output of at least one of the comparators 250, 260 and/or 262, e.g., the Schmitt Trigger 260 and/or the Schmitt Trigger 262 of FIG. 19, to automatically tune the excitation time.

In this way, a desired number of digital pulses may be achieved, which usually corresponds to a given reference condition (e.g., with metal). For example, the reference condition usually corresponds to the situation with the greatest damping factor, which corresponds to the oscillation with the lowest expectable number of pulses in the output CMP of the comparators 250, 260 and/or 262.

By way of example, in some embodiments, a closed-loop regulation may be used to set the excitation time to ensure that the number of pulses for a given reference condition, e.g., the condition with the greatest damping factor, corresponds to the target number of pulses K. For example, in this case, when measuring the reference condition, the number of pulses at the output of the comparator may comprise K counts, and the number of pulses will increase in conditions with a lower damping factor.

Without prejudice to the principle of the invention, the details of construction and the embodiments may vary with respect to what has been described and illustrated herein purely by way of example, without thereby departing from the scope of the present invention, as defined by the ensuing claims.

The invention claimed is:

1. A method of interfacing an LC sensor with a controller, the controller comprising first and second contacts and a clamping circuit defining an upper voltage threshold and a lower voltage threshold, the LC sensor being coupled between the first and second contacts, and a capacitor being coupled between the first contact and ground, the method comprising:
    starting an oscillation of the LC sensor;
    monitoring a voltage at the second contact, the voltage at the second contact corresponding to a sum of a voltage at the first contact and a voltage associated with the LC sensor;
    varying the voltage at the first contact so that the voltage at the second contact does not exceed the upper voltage threshold and does not fall below the lower voltage threshold;
    during a first phase, connecting the first contact to ground so that the capacitor is discharged;
    during a second phase, connecting the first contact to ground and connecting the second contact to a supply voltage so that the LC sensor is charged; and
    during a third phase, placing the first contact and the second contact in a high impedance state so that the LC sensor oscillates and the voltage at the second contact is limited by charging or discharging the capacitor through the clamping circuit.

2. The method of claim 1 wherein varying the voltage at the first contact comprises generating a counter-oscillation at the first contact, the counter-oscillation being phase-shifted with respect to the oscillation of the LC sensor.

3. The method of claim 1 wherein varying the voltage at the first contact comprises:
when the voltage at the second contact reaches the upper voltage threshold, decreasing the voltage at the first contact; and
when the voltage at the second contact reaches the lower voltage threshold, increasing the voltage at the first contact.

4. The method of claim 1, wherein the clamping circuit comprises a first diode coupled between the second contact and the supply voltage, and a second diode coupled between ground and the second contact.

5. The method of claim 1, further comprising varying a duration of the second phase to regulate an amplitude of the oscillation of the LC sensor at a beginning of the third phase.

6. A method of interfacing an LC sensor with a controller, the controller comprising first and second contacts and a clamping circuit defining an upper voltage threshold and a lower voltage threshold, the LC sensor being coupled between the first and second contacts, and a capacitor being coupled between the first contact and ground, the method comprising:
starting an oscillation of the LC sensor;
monitoring a voltage at the second contact, the voltage at the second contact corresponding to a sum of a voltage at the first contact and a voltage associated with the LC sensor;
varying the voltage at the first contact so that the voltage at the second contact does not exceed the upper voltage threshold and does not fall below the lower voltage threshold;
during a first phase, connecting the first contact to a supply voltage so that the capacitor is charged;
during a second phase, connecting the first contact to the supply voltage and connecting the second contact to ground so that the LC sensor is charged; and
during a third phase, placing the first contact and the second contact in a high impedance state so that the LC sensor oscillates and the voltage at the second contact is limited by charging or discharging the capacitor through the clamping circuit.

7. The method of claim 6 further comprising varying a duration of the second phase to regulate an amplitude of the oscillation of the LC sensor at a beginning of the third phase.

8. The method of claim 1 further comprising monitoring at least one of the voltages at the first and second contacts via a Schmitt Trigger.

9. A system comprising:
a controller comprising first and second contacts and a clamping circuit defining an upper voltage threshold and a lower voltage threshold;
an LC sensor coupled between the first and second contacts; and
a capacitor being coupled between the first contact and ground;
said controller being configured to
start an oscillation of said LC sensor,
monitor a voltage at the second contact, the voltage at the second contact corresponding to a sum of a voltage at the first contact and a voltage associated with said LC sensor,
vary the voltage at the first contact so that the voltage at the second contact does not exceed the upper voltage threshold and does not fall below the lower voltage threshold,
during a first phase, connect the first contact to ground so that the capacitor is discharged,
during a second phase, couple the first contact to ground and connect the second contact to a supply voltage so that the LC sensor is charged, and
during a third phase, place the first contact and the second contact in a high impedance state so that the LC sensor oscillates and the voltage at the second contact is limited by charging or discharging the capacitor through the clamping circuit.

10. The system of claim 9 wherein said controller is configured to vary the voltage at the first contact by generating a counter-oscillation at the first contact, the counter-oscillation being phase-shifted with respect to the oscillation of the LC sensor.

11. The system of claim 9 wherein said controller is configured to vary the voltage at the first contact by,
when the voltage at the second contact reaches the upper voltage threshold, decreasing the voltage at the first contact, and
when the voltage at the second contact reaches the lower voltage threshold, increasing the voltage at the first contact.

12. The system of claim 9, wherein said clamping circuit comprises a first diode coupled between the second contact and the supply voltage, and a second diode coupled between a reference voltage and the second contact.

13. The system of claim 9, wherein said controller is further configured to vary a duration of the second phase to regulate an amplitude of the oscillation of the LC sensor at a beginning of the third phase.

14. A system comprising:
a controller comprising first and second contacts and a clamping circuit defining an upper voltage threshold and a lower voltage threshold;
an LC sensor coupled between the first and second contacts; and
a capacitor being coupled between the first contact and ground;
said controller being configured to
start an oscillation of said LC sensor,
monitor a voltage at the second contact, the voltage at the second contact corresponding to a sum of a voltage at the first contact and a voltage associated with said LC sensor,
vary the voltage at the first contact so that the voltage at the second contact does not exceed the upper voltage threshold and does not fall below the lower voltage threshold,
during a first phase, connect the first contact to a supply voltage so that the capacitor is charged;
during a second phase, connect the first contact to the supply voltage and connect the second contact to ground so that the LC sensor is charged; and
during a third phase, place the first contact and the second contact in a high impedance state so that the LC sensor oscillates and the voltage at the second contact is limited by charging or discharging the capacitor through the clamping circuit.

15. The system of claim 14 wherein said controller is further configured to vary a duration of the second phase to regulate an amplitude of the oscillation of said LC sensor at a beginning of the third phase.

16. The system of claim 9 further comprising a Schmitt Trigger coupled to at least one of the first and second contacts; and wherein said controller is further configured to monitor at least one of the voltages at the first and second contacts via said Schmitt Trigger.

17. The system of claim 9 wherein said controller is integrated in an integrated circuit.

18. The system of claim 9 wherein said controller comprises a microprocessor.

19. The system of claim 9 further comprising:
a first three state output driving circuit configured for selectively coupling the first contact to ground, the supply voltage, or placing the first contact in the high impedance state;
a second three state output driving circuit configured for selectively coupling the second contact to a reference voltage, the supply voltage, or placing the second contact in the high impedance state; and
at least one input sensing circuit associated with at least one of the first and said second contacts, said input sensing circuit comprising a Schmitt Trigger.

20. A controller for use with an LC sensor, the controller comprising:
first and second contacts, and a clamping circuit defining an upper voltage threshold and a lower voltage threshold, the LC sensor to be coupled between the first and second contacts, a capacitor to be coupled between the first contact and ground; and
a processor coupled to the first and second contacts and configured to
start an oscillation of the LC sensor,
monitor a voltage at the second contact, the voltage at the second contact corresponding to a sum of a voltage at the first contact and a voltage associated with the LC sensor,
vary the voltage at the first contact so that the voltage at the second contact does not exceed the upper voltage threshold and does not fall below the lower voltage threshold,
during a first phase, connect the first contact to ground so that the capacitor is discharged,
during a second phase, couple the first contact to ground and connect the second contact to a supply voltage so that the LC sensor is charged, and
during a third phase, place the first contact and the second contact in a high impedance state so that the LC sensor oscillates and the voltage at the second contact is limited by charging or discharging the capacitor through the clamping circuit.

21. The controller of claim 20 wherein said processor is configured to vary the voltage at the first contact by generating a counter-oscillation at the first contact, the counter-oscillation being phase-shifted with respect to the oscillation of the LC sensor.

22. The controller of claim 20 wherein said processor is configured to vary the voltage at the first contact by,
when the voltage at the second contact reaches the upper voltage threshold, decreasing the voltage at the first contact, and
when the voltage at the second contact reaches the lower voltage threshold, increasing the voltage at the first contact.

23. The controller of claim 20, wherein said clamping circuit comprises a first diode coupled between the second contact and the supply voltage, and a second diode coupled between ground and the second contact.

24. A non-transitory computer-readable medium for a controller having first and second contacts for connecting an LC sensor therebetween and for connecting a capacitor between the first contact and ground, the controller further comprising a clamping circuit defining an upper voltage threshold and a lower voltage threshold, the computer-readable having computer-executable instructions for causing the controller to perform steps comprising:
starting an oscillation of the LC sensor;
monitoring a voltage at the second contact, the voltage at the second contact corresponding to a sum of a voltage at the first contact and a voltage associated with the LC sensor;
varying the voltage at the first contact so that the voltage at the second contact does not exceed the upper voltage threshold and does not fall below the lower voltage threshold;
during a first phase, connecting the first contact to ground so that the capacitor is discharged;
during a second phase, connecting the first contact to ground and connecting the second contact to a supply voltage so that the LC sensor is charged; and
during a third phase, placing the first contact and the second contact in a high impedance state so that the LC sensor oscillates and the voltage at the second contact is limited by charging or discharging the capacitor through the clamping circuit.

25. The non-transitory computer-readable medium of claim 24 wherein varying the voltage at the first contact comprises varying the voltage at the first contact by generating a counter-oscillation at the first contact, the counter-oscillation being phase shifted with respect to the oscillation of the LC sensor.

26. The non-transitory computer-readable medium of claim 24 wherein varying the voltage at the first contact comprises varying the voltage at the first contact by,
when the voltage at the second contact reaches the upper voltage threshold, decreasing the voltage at the first contact, and
when the voltage at the second contact reaches the lower voltage threshold, increasing the voltage at the first contact.

* * * * *